(12) United States Patent
Hall, Jr. et al.

(10) Patent No.: US 6,346,842 B1
(45) Date of Patent: *Feb. 12, 2002

(54) VARIABLE DELAY PATH CIRCUIT

(75) Inventors: Stephen H. Hall, Jr., Forest Grove; Maynard C. Falconer, Hillsboro, both of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,836

(22) Filed: Dec. 12, 1997

(51) Int. Cl.[7] .............................................. H03H 11/26
(52) U.S. Cl. ...................... 327/277; 327/384; 327/290; 327/565
(58) Field of Search ................................ 327/261, 262, 327/269, 270, 271, 276, 277, 278, 284, 283, 290, 292, 293, 294, 564, 565; 174/255; 361/748, 760, 762

(56) References Cited

U.S. PATENT DOCUMENTS

| 4,758,459 | A | * | 7/1988 | Mehta | 428/131 |
|---|---|---|---|---|---|
| 4,935,284 | A | * | 6/1990 | Puerner | 428/137 |
| 5,008,631 | A | * | 4/1991 | Scherer et al. | 330/51 |
| 5,109,270 | A | * | 4/1992 | Nambu et al. | 357/74 |
| 5,444,187 | A | * | 8/1995 | Bree et al. | 174/260 |
| 5,519,734 | A | * | 5/1996 | Ben-Efraim | 375/341 |
| 5,545,924 | A | * | 8/1996 | Contolatis et al. | 257/724 |
| 5,646,568 | A | * | 7/1997 | Sato | 327/276 |
| 5,708,569 | A | * | 1/1998 | Howard et al. | 361/760 |
| 5,719,514 | A | * | 2/1998 | Sato | 327/262 |
| 5,831,459 | A | * | 11/1998 | McDonald | 327/141 |
| 5,872,338 | A | * | 2/1999 | Lan et al. | 174/255 |
| 6,219,255 | B1 | * | 4/2001 | Teshome | 361/794 |

* cited by examiner

Primary Examiner—Timothy P. Callahan
Assistant Examiner—Hai L. Nguyen
(74) Attorney, Agent, or Firm—Blakely, Sokoloff, Taylor & Zafman LLP

(57) ABSTRACT

A variable delay path circuit having delay paths of different lengths is disclosed. Any of the delay paths can be selected to match the operating conditions of the system. In one embodiment of the invention, a delay path circuit having two delay paths connects a driver and receiver. Each of the two delay paths contains sites at both ends for placing zero ohm resistors, solder or copper slugs. To select one of the two delay paths, zero ohm resistors, solder or copper slugs are placed in the sites at the ends of the desired delay path. The delay is then dictated by the time it takes for a clocking signal to travel the length of selected delay path.

26 Claims, 10 Drawing Sheets

VARIABLE DELAY PATH CIRCUIT

FIELD OF THE INVENTION

The present invention relates to electrical circuits, specifically to an assembly for configuring electrical circuits.

BACKGROUND OF THE INVENTION

Computer systems are increasingly using source synchronous bus designs, which have extremely narrow timing windows. To ensure the collection of correct data at a receiver, a driver must send a clocking signal that is centered as much as possible in a narrow timing window. Typically, the clocking signal arrives just after a data signal arrives at a receiver, and the clocking signal latches in the data into the receiver. The receiver needs a certain setup time to allow it to prepare to receive a data signal, and the receiver also has a hold time requirement which guarantees that the data signal is held at the receiver for a sufficient time to be sampled correctly. Thus, for the receiver to latch in valid data at the correct times, as dictated by the setup and hold times, the clocking signal must be closely centered in the timing window.

However, the operating frequencies of computer systems are always increasing, and timing problems can occur at the maximum and minimum operating frequencies of a given design. For example, at low frequencies setup time problems can occur, which means that the clocking signal arrives too quickly; at high frequencies hold time problems can occur, which means that the clocking signal arrives too slowly. In both situations, the clocking signal is not guaranteed to latch in the correct data.

A conventional solution to the timing problems is to compromise between the low and high frequencies such that one board can be used for a range of operating frequencies. However, this is not always possible or practical. Nonetheless, to achieve this compromise, the trace lengths of the clocking signal pathways and the data signal pathways must have some length differential among them.

In a source synchronous bus design, it is usually desirable to decrease trace length differences. Trace length differences can exacerbate setup problems at low frequencies and hold problems at high frequencies. A variable delay clock trace would help mitigate these timing problems by adjusting the clock delay for a given frequency. This would then allow a single board to be manufactured and used for applications at both low frequencies and high frequencies, thereby saving money by eliminating the need to manufacture multiple boards.

SUMMARY OF THE INVENTION

A variable delay path circuit that has at least two delay paths of different lengths is disclosed. In one embodiment, the circuit includes a central processing unit and a memory device that are connectable through either a first delay path or a second delay path.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

A variable delay path circuit with individually selectable delay paths of different lengths is described. In the following description, specific details are set forth, such as material types, in order to provide a thorough understanding of the present invention. However, it will be obvious to one of ordinary skill in the art that the invention may be practiced without these specific details. In other instances, well-known structures and processing steps have not been shown in particular detail in order to avoid unnecessarily obscuring the present invention.

Figure 1A:
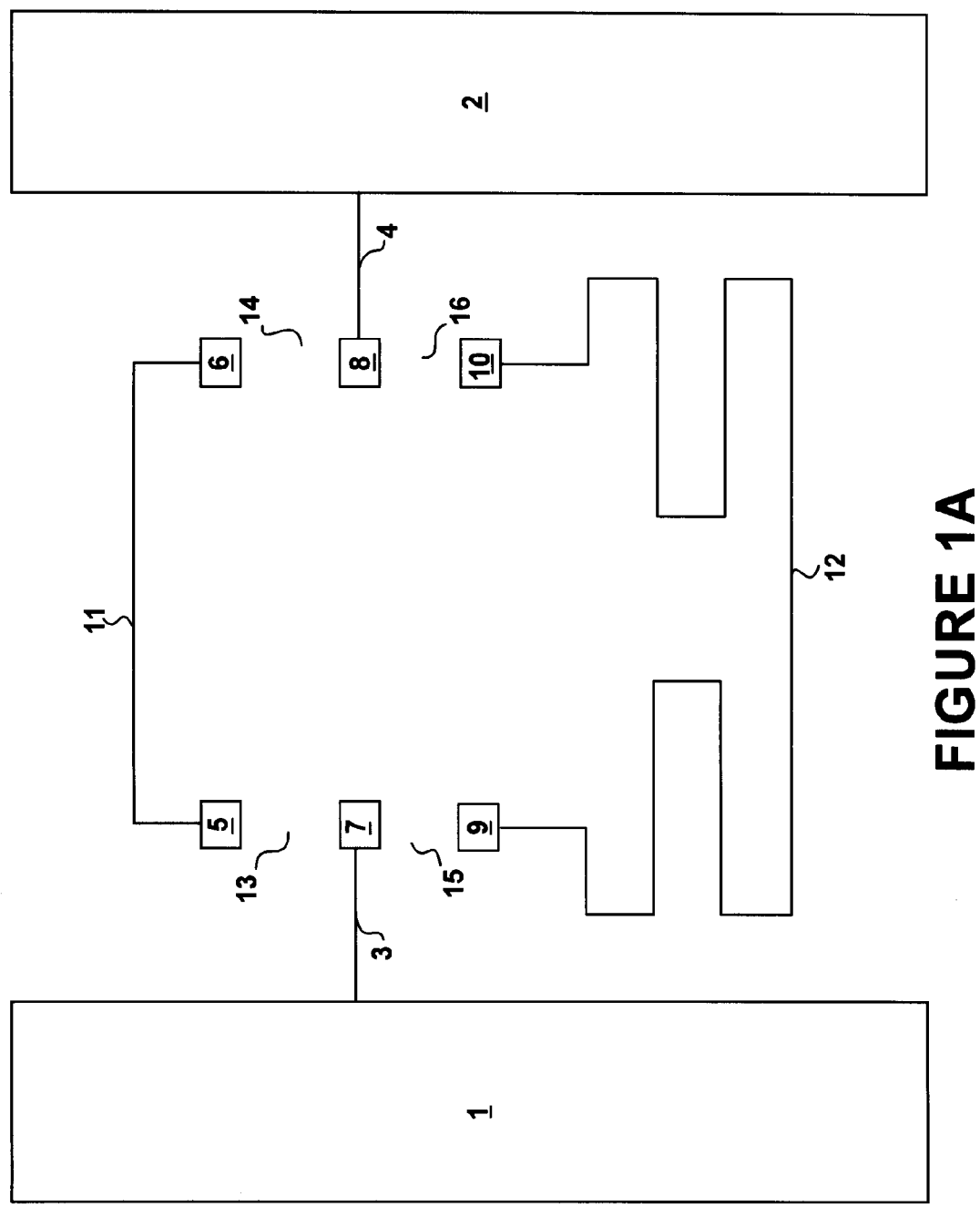
FIG. 1A illustrates a variable delay circuit in accordance with one embodiment of the present invention.

With reference to FIG. 1A, a top view of one embodiment of the present invention is shown. A driver 1, which, for example, can be a microprocessor, is electrically coupled to a terminal 7 by a trace 3. A receiver 2, which, for example, can be a memory device, is electrically coupled to a terminal 8 by a trace 4. A first delay path 11 is electrically coupled to terminals 5 and 6, which are separated from terminals 7 and 8 by spaces 13 and 14, respectively. A second delay path 12 is electrically coupled to terminals 9 and 10, which are separated from terminals 7 and 8 by spaces 15 and 16, respectively. Delay path 12 is longer than delay path 11. Terminals 5 through 10 can be, for example, mounting pads, which are made of exposed metal. Traces 3 and 4 and delay paths 11 and 12 are typically made of copper, but may be made of any electrically conductive material.

By being made of exposed metal, terminals 5 through 10 are readily electrically connectable to one another using any electrically conductive material to establish the electrical connection. Furthermore, being able to choose from more than one delay path by establishing electrical connections between different sets of terminals provides great flexibility and widespread application to systems of varying operating frequencies.

Figure 1B:
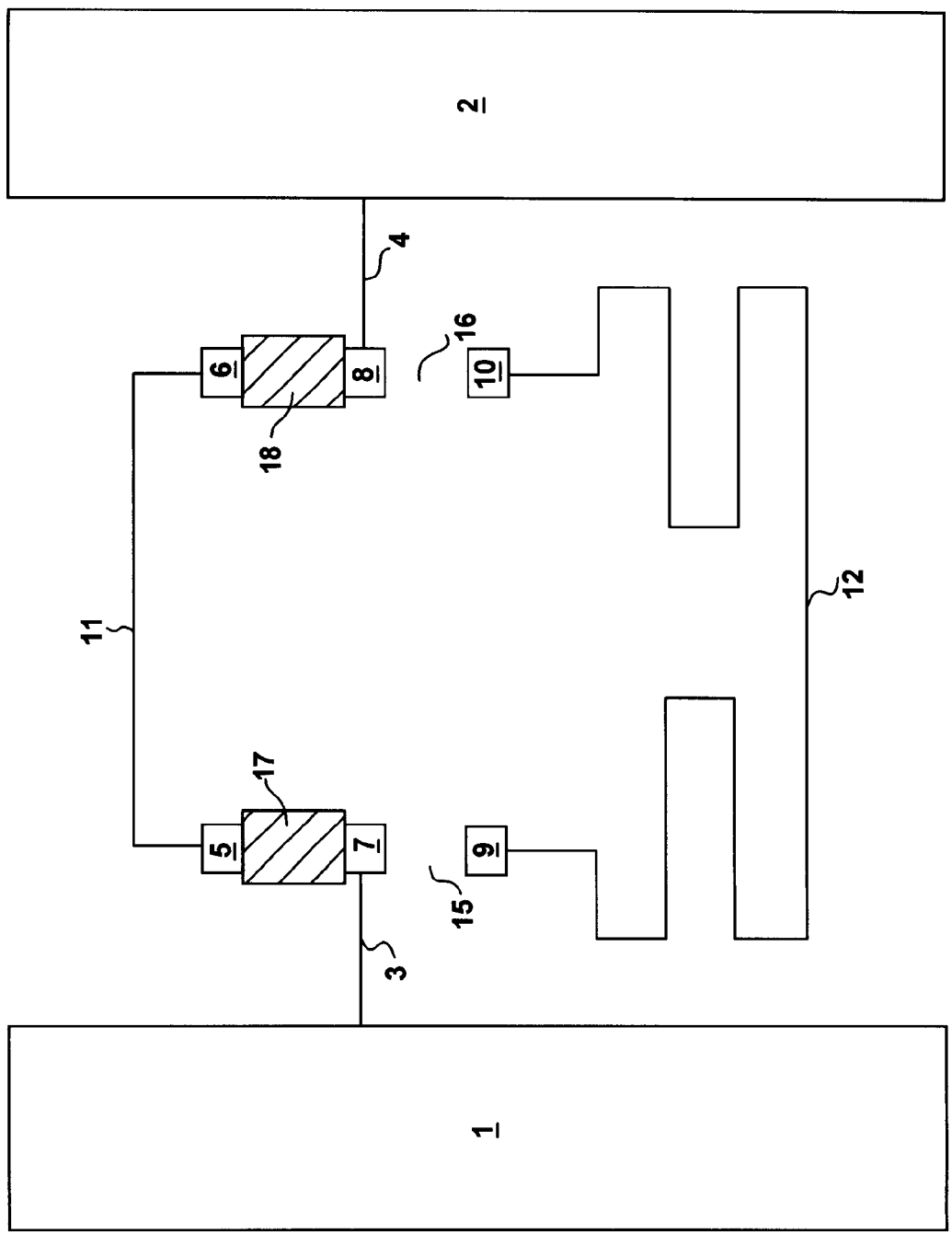
FIG. 1B illustrates the circuit shown in FIG. 1A, wherein the shorter delay path is selected between a driver and a receiver.

In FIG. 1B, a top view of the circuit shown in FIG. 1A is shown with the driver and receiver being coupled through the first delay path 11. Terminals 7 and 5 are electrically coupled by an electrically conductive member 17, which is disposed in space 13 so that electrically conductive member 17 makes contact with terminals 7 and 5. Terminals 8 and 6 are electrically coupled by an electrically conductive member 18, which is disposed in space 14 so that electrically conductive member 18 makes contact with terminals 8 and 6. Driver 1 and receiver 2 are thereby connected via trace 3, terminal 7, electrically conductive member 17, terminal 5, delay path 11, terminal 6, electrically conductive member 18, terminal 8, and trace 4. Electrically conductive members 17 and 18 can be, but are not limited to, zero ohm resistors, solder or copper slugs.

Figure 1C:
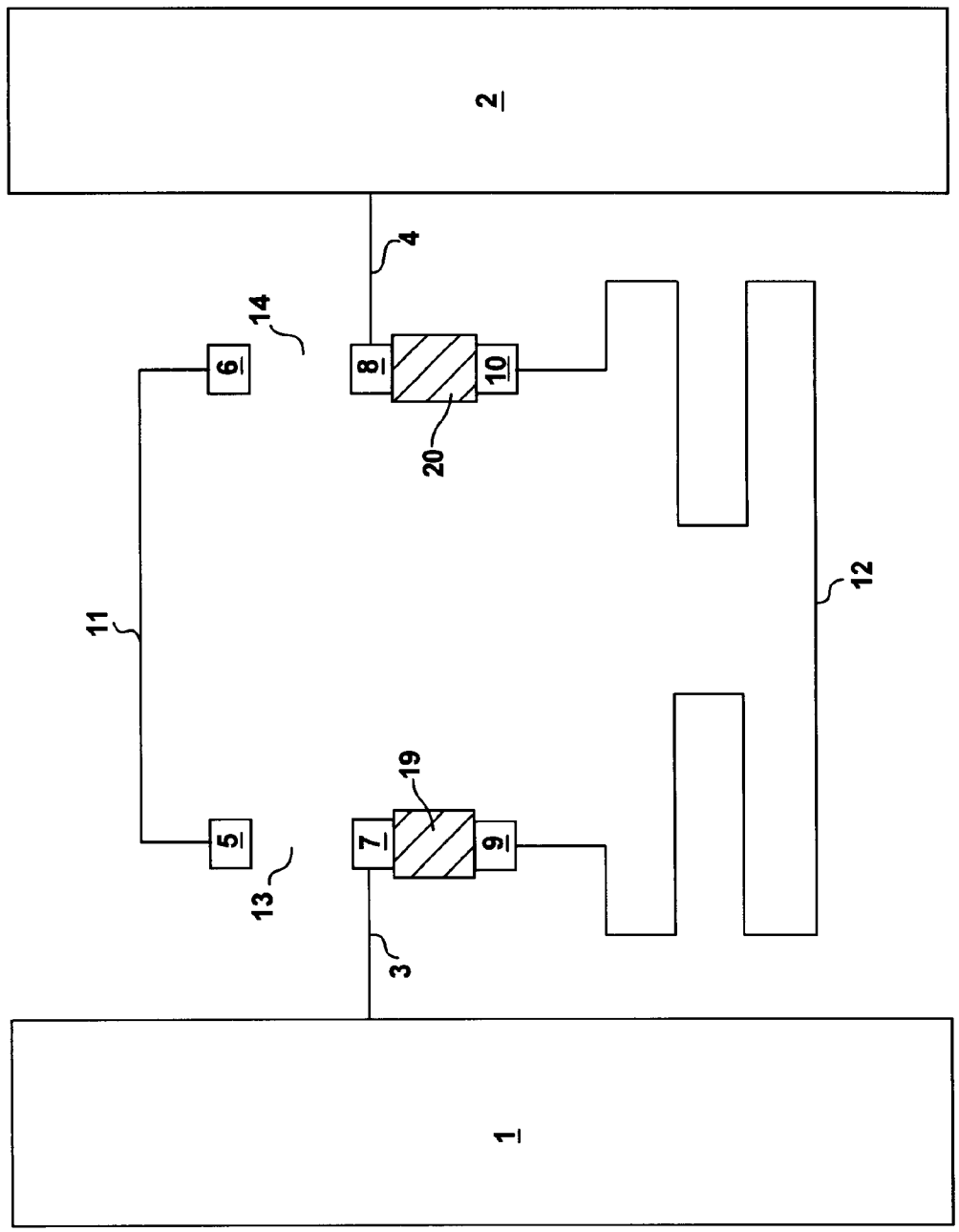
FIG. 1C illustrates the circuit shown in FIG. 1A, wherein the longer delay path is selected between a driver and a receiver.

FIG. 1C illustrates a top view of the circuit shown in FIG. 1A with the second delay path 12 selected. Terminals 7 and 9 are electrically coupled by an electrically conductive member 19, which is disposed in space 15 so that electrically conductive member 19 makes contact with terminals 7 and 9. Terminals 8 and 10 are electrically coupled by an electrically conductive member 20, which is disposed in space 16 so that electrically conductive member 20 makes contact with terminals 8 and 10. Driver 1 and receiver 2 are thereby connected via trace 3, terminal 7, electrically conductive member 19, terminal 9, delay path 12, terminal 10, electrically conductive member 20, terminal 8, and trace 4. Electrically conductive members 19 and 20 can be, but are not limited to, zero ohm resistors, solder or copper slugs.

Figure 2A:
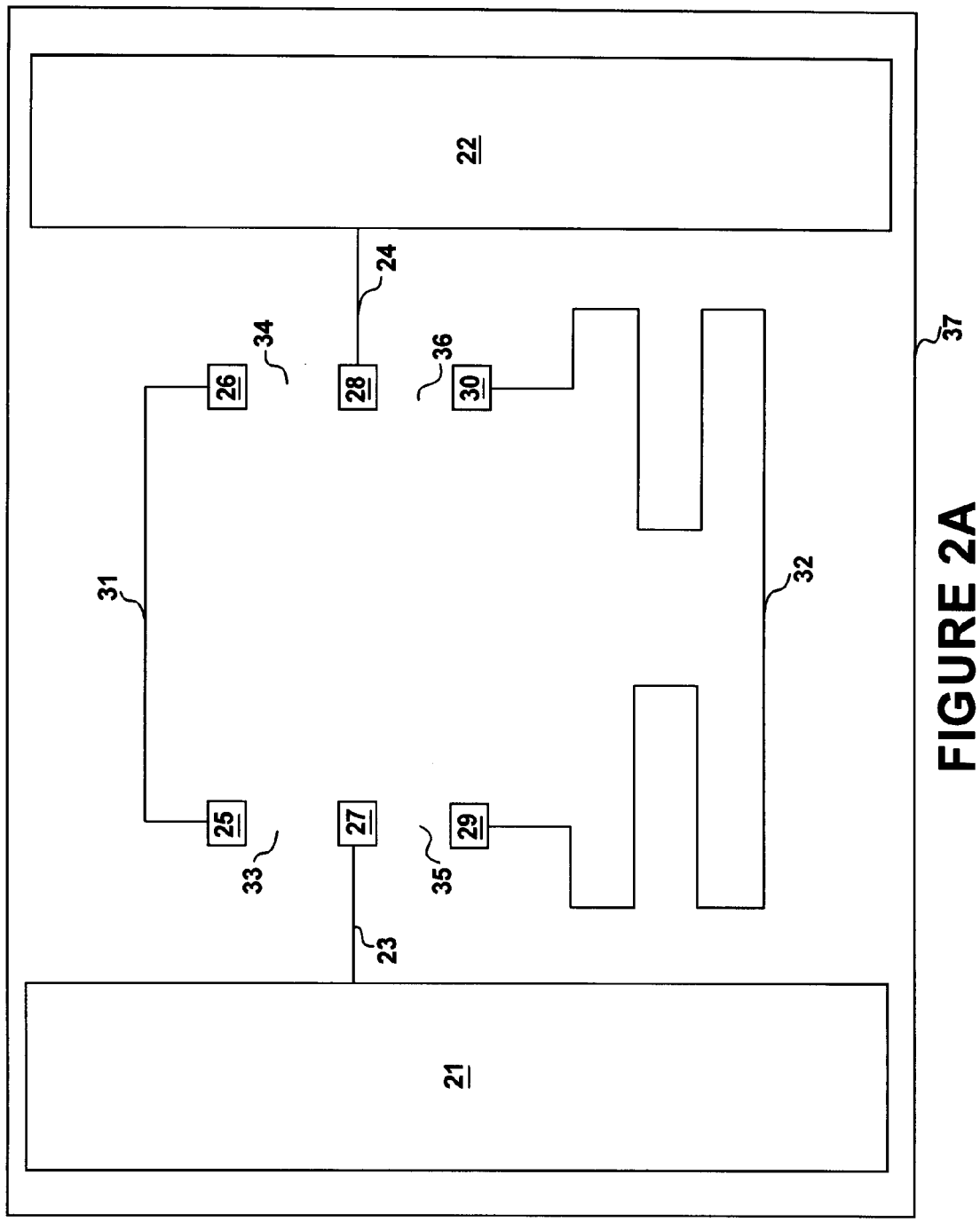
FIG. 2A illustrates a top view of a printed circuit board containing a variable delay circuit.
Figure 2B:
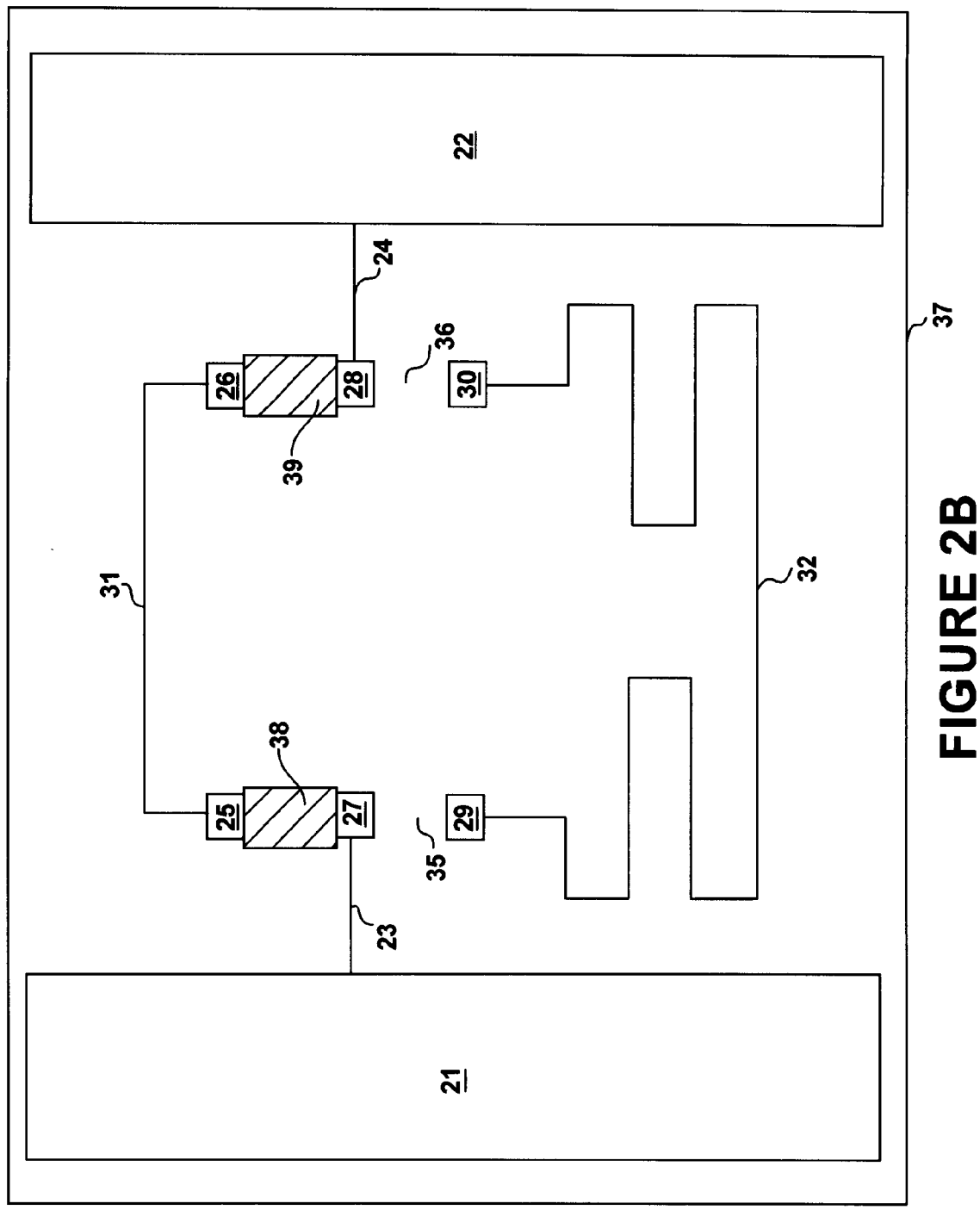
FIG. 2B illustrates the printed circuit board of FIG. 2A, wherein the shorter delay path is selected between a driver and a receiver.
Figure 2C:
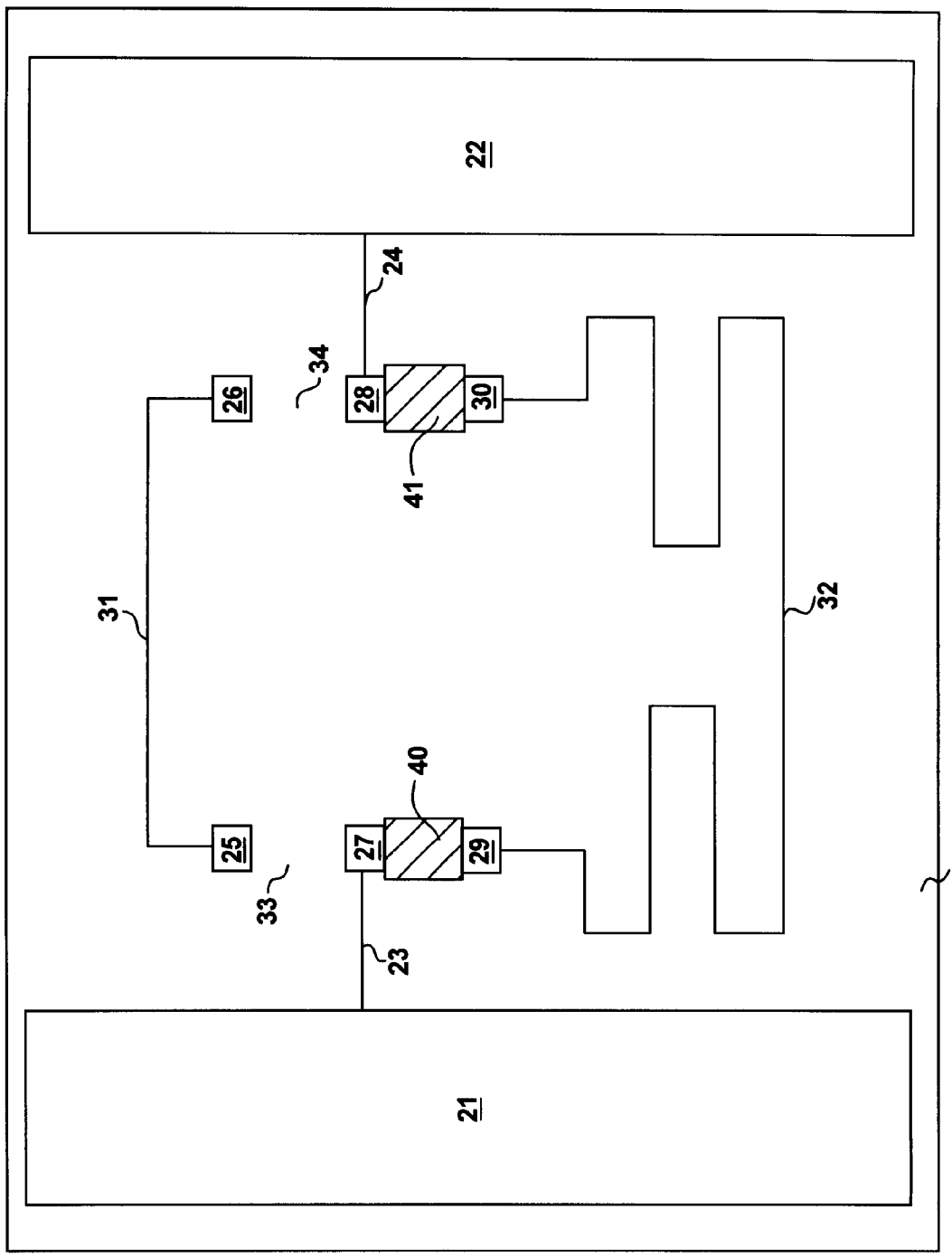
FIG. 2C illustrates the printed circuit board of FIG. 2A, wherein the longer delay path is selected between a driver and a receiver.

FIGS. 2A through 2C illustrate a variable delay circuit located between a central processing unit 21 and a memory device 22 and disposed on a printed circuit board 37. Printed circuit board 37 can consist of six alternating layers of fiberglass and copper. A significant advantage of the present invention is that, because more than one delay path is on the same board, it makes possible the manufacture of only one type of board that can be used for systems of different operating frequencies.

Figure 3A:
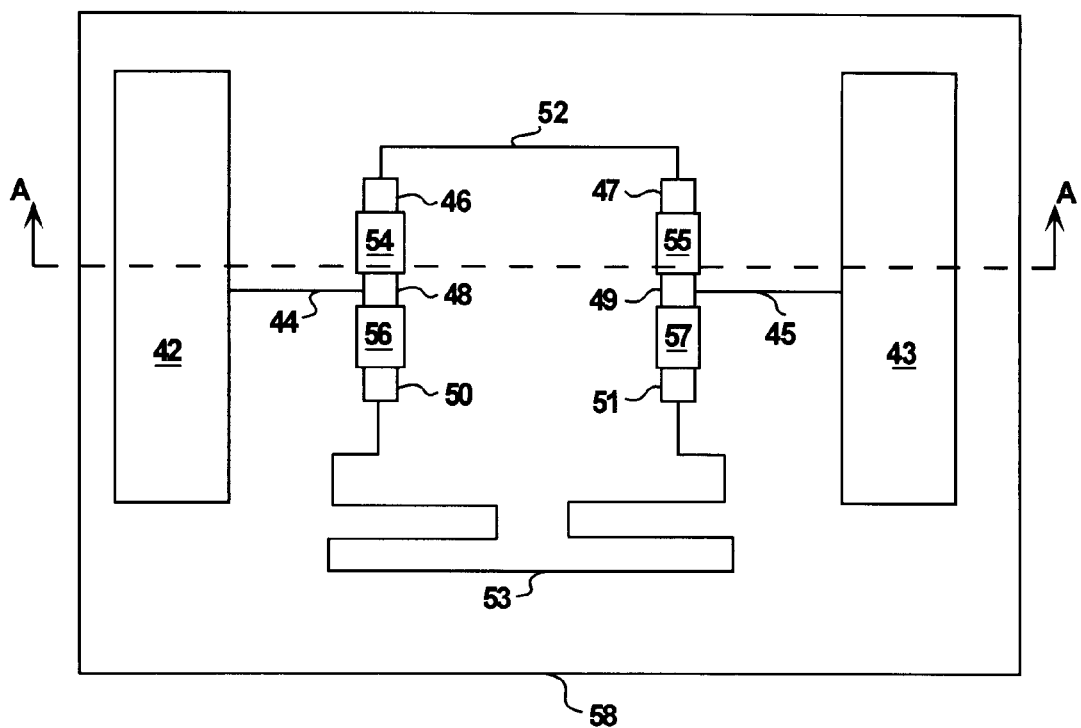
FIG. 3A illustrates a top view another embodiment of the present invention.

With reference to FIG. 3A, a top view of another embodiment of the present invention is shown. FIG. 3A is similar to FIG. 2A; however, in FIG. 3A, recesses 54 through 57 are provided in a printed circuit board 58 to separate terminals 46 and 48, 47 and 49, 48 and 50, and 49 and 51, respectively.

Figure 3B:
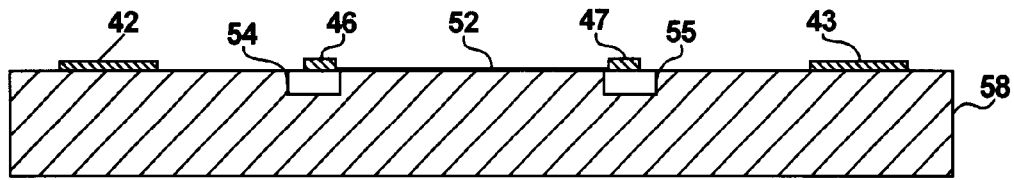
FIG. 3B illustrates a cross-sectional view of the embodiment of FIG. 3A along line A—A.

In FIG. 3B, a cross-sectional view of the embodiment of FIG. 3A is shown along line A—A.

Figure 3C:
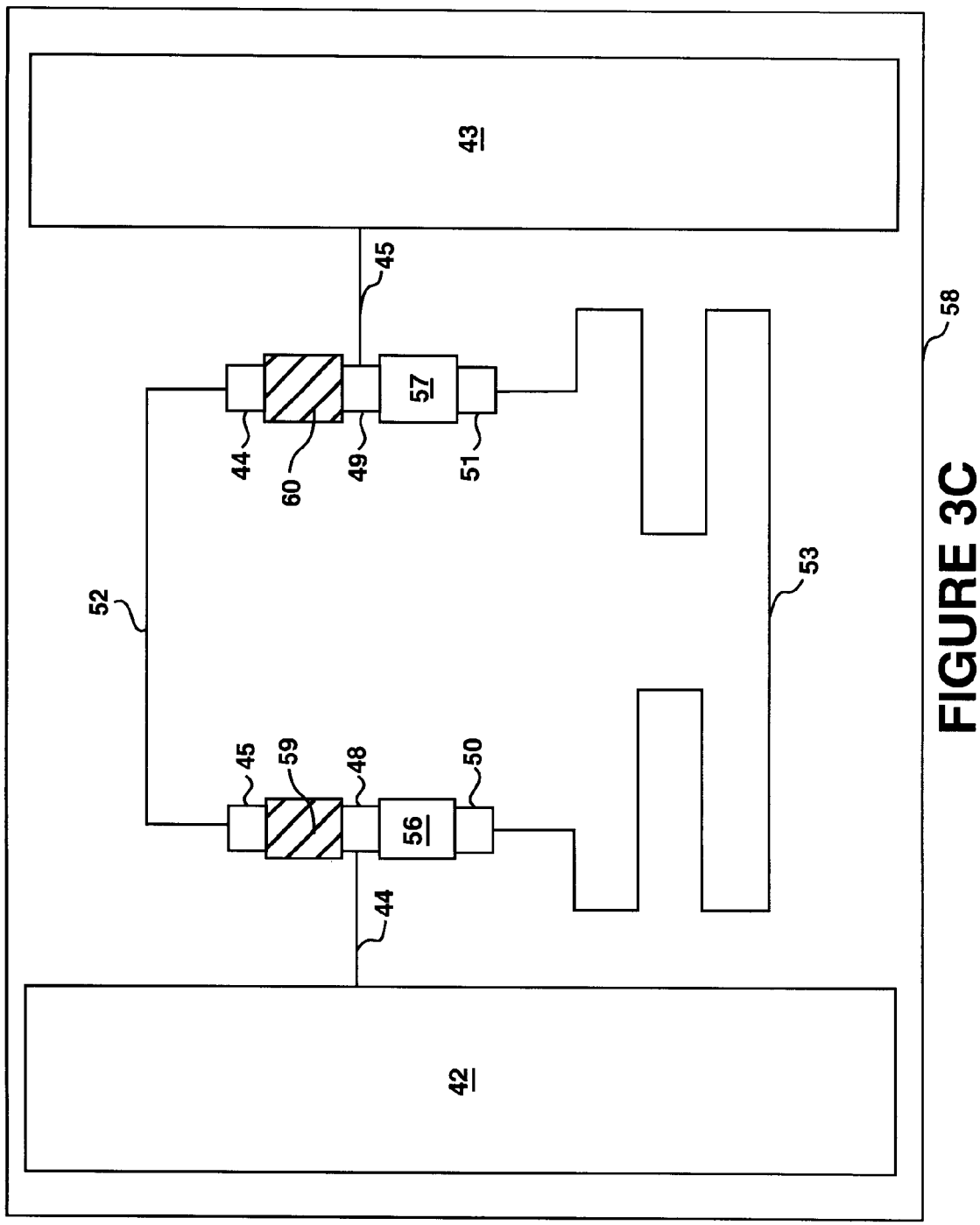
FIG. 3C illustrates a top view of the embodiment of FIG. 3A, wherein the shorter delay path is selected between a driver and a receiver.

FIG. 3C shows a top view of the circuit depicted in FIG. 3A with a first delay path 52 selected. Terminals 48 and 46 are electrically coupled by an electrically conductive member 59, which is disposed in recess 54 so that electrically conductive member 59 makes contact with terminals 48 and 46. Terminals 49 and 47 are electrically coupled by an electrically conductive member 60, which is disposed in recess 55 so that electrically conductive member 60 makes contact with terminals 49 and 47. A central processing unit 42 and a memory device 43 are thereby connected via a trace 44, terminal 48, electrically conductive member 59, terminal 46, first delay path 52, terminal 47, electrically conductive member 60, terminal 49, and a trace 45.

Figure 3D:
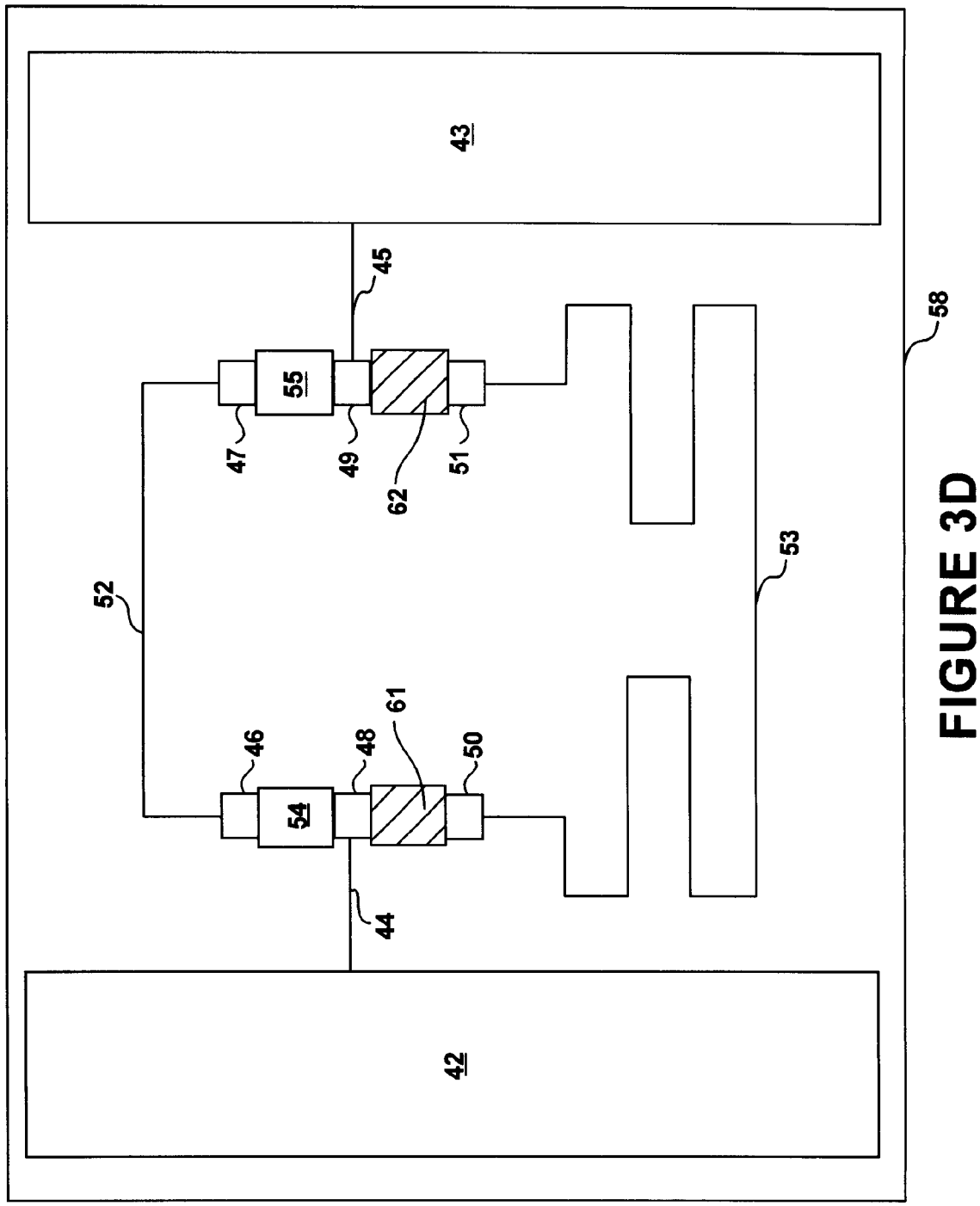
FIG. 3D illustrates a top view of the embodiment of FIG. 3A, wherein the longer delay path is selected between a driver and a receiver.

FIG. 3D is a top view of the circuit shown in FIG. 3A with a second delay path 53 selected. Terminals 48 and 50 are electrically coupled by an electrically conductive member 61, which is disposed in recess 56 so that electrically conductive member 61 makes contact with terminals 48 and 50. Terminals 49 and 51 are electrically coupled by an electrically conductive member 62, which is disposed in recess 57 so that electrically conductive member 62 makes contact with terminals 49 and 51. Central processing unit 42 and memory device 43 are thereby connected via trace 44, terminal 48, electrically conductive member 61, terminal 50, second delay path 53, terminal 51, electrically conductive member 62, terminal 49, and trace 45.

Figure 4:
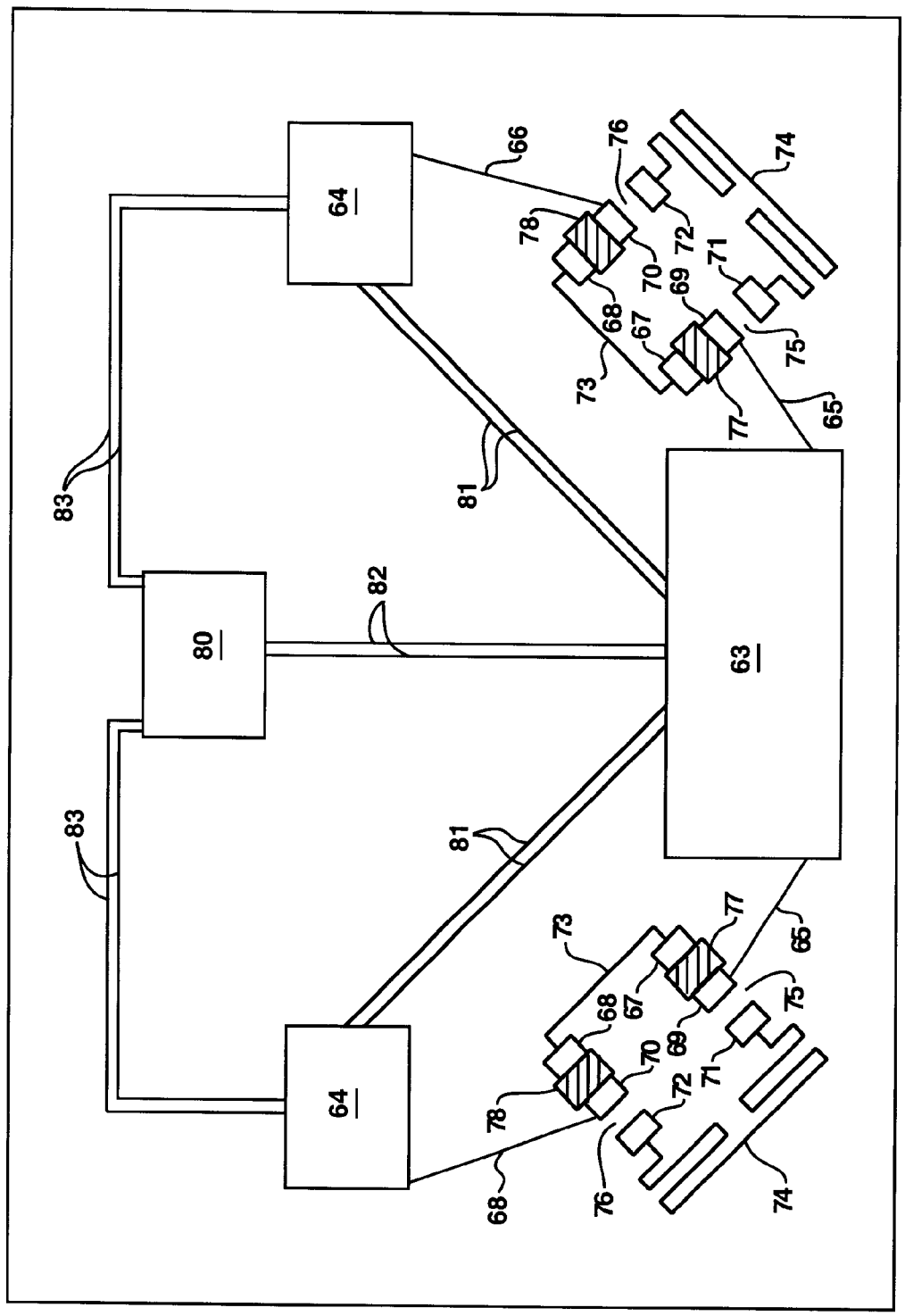
FIG. 4 illustrates a top view of yet another embodiment of the present invention.

FIG. 4 illustrates a top view of yet another embodiment of the present invention. For descriptive purposes, the assembly shown in FIG. 4 is deemed to incorporate a source synchronous bus design. Located on a printed circuit board 79 are four main components: a central processing unit 63, two memory devices 64, and an addressing interface 80. Clock lines 82 connect central processing unit 63 and addressing interface 80. Addressing lines 83 connect each memory device 64 to addressing interface 80. Data lines 81 also connect each memory device 64 to central processing unit 63. For simplicity, only two data lines 81 are shown connecting each memory device 64 to central processing unit 63. It is appreciated, however, that the number of data lines will typically correspond to the width of the corresponding data bus. Clock lines 82 and addressing lines 83 will typically consist of more than two lines. Furthermore, each memory device 64 is connected to central processing unit 63 through a first delay path 73 of a variable delay circuit similar to the one shown in FIG. 2B. All of the traces on printed circuit board 79, including traces 65 and 66, delay paths 73 and 74, data lines 81, clock lines 82, and addressing lines 83, are approximately 0.005 inches wide and 1 to 4 inches long, depending on the placement of the four main components and the range of operating frequencies. For example, for a low operating frequency of 266 MHz, the longer delay path 74 would be approximately 3.5 to 4 inches long, and for a high operating frequency of 400 MHz, the shorter delay path would be approximately 2.5 inches long.

The advantages of the present invention become apparent by describing a data retrieval operation of the assembly of FIG. 4 in a source synchronous bus design. Central processing unit 63 may require data which it does not have. In such an instance, central processing unit 63 sends the address of the desired data to addressing interface 80 along clock lines 82. Addressing interface 80 then converts the address of the desired data and sends the converted address to each of the memory devices 64 along addressing lines 83. Just after central processing unit 63 sends the address of the desired data to addressing interface 80, central processing unit 63 sends a clocking signal along one of the selected delay paths of the present invention. The typical problem at high frequency operation is that the clocking signal arrives at the memory devices 64 too slowly, which means that not all of the correct data is latched by the clocking signal. Thus, the arrival of the clocking signal needs to be hastened. As shown in FIG. 4, this is accomplished by selecting the shorter delay path 73. After the clocking signal reaches the memory devices 64 and latches data, the memory devices 64 send back the latched data and a clock strobe to central processing unit 63 along data lines 81. For low frequency operation, the longer delay path 74 would be selected.

With particular reference to computer systems using source synchronous bus designs, the present invention provides a solution to the timing problems in source synchronous bus designs that provides numerous advantages over the common solution of manufacturing a compromise board. For example, the present invention eliminates the need to manufacture multiple boards in order to optimize operation at varying frequencies by having selectable delay paths of different lengths on the same board. Being able to manufacture one board for a range of operating frequencies greatly decreases board costs. The compromise board can be used over a range of operating frequencies because the required length differential among the clocking signal pathways and the data pathways is achieved by adding excess length to the data pathways. However, because the number of data pathways is equal to the width of the data bus, the excess length added to each of the data pathways takes up an inordinate amount of space on the board. The present invention saves much of the space occupied by the excess length added to the data pathways by allowing the length of the delay path to be selected according to the operating frequency of the system. The space-saving feature of the present invention allows the saved space to be used for other purposes, and it also allows for the manufacture of smaller boards, which lowers costs.

The details, such as dimensions and materials, set forth within the specification are exemplary of the disclosed embodiments only. While numerous alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. A variable delay path circuit comprising:
   an input;
   an output;
   a first delay path having a first length, said first delay path and said input separated by a first gap; and
   a second delay path having a second length, said second length being longer than said first length, said second delay path and said output separated by a second gap, said gaps being recessed in a printed circuit board, said input and said output being connectable to said first delay path and said second delay path across said first gap and said second gap, respectively, using an electrically conductive member, said electrically conductive member being a passive member.

2. The variable delay path of claim 1 wherein:
   said input comprises a first terminal and said output comprises a second terminal;
   said first delay path comprises a third terminal and a fourth terminal, and said second delay path comprises a fifth terminal and a sixth terminal;
   said first terminal of said input is connectable to said third terminal of said first delay path;
   said second terminal of said output is connectable to said fourth terminal of said first delay path;
   said first terminal of said input is further connectable to said fifth terminal of said second delay path; and
   said second terminal of said output is further connectable to said sixth terminal of said second delay path.

3. The variable delay path of claim 2 wherein said first and third terminals are electrically coupled by a first electrically conductive member and said second and fourth terminals are electrically coupled by a second electrically conductive member.

4. The variable delay path of claim 2 wherein said first and fifth terminals are electrically coupled by a third electrically conductive member and said second and sixth terminals are electrically coupled by a fourth electrically conductive member.

5. The variable delay path of claim 3 wherein said first and second electrically conductive members comprise zero ohm resistors.

6. The variable delay path of claim 4 wherein said third and fourth electrically conductive members comprise zero ohm resistors.

7. A variable delay path circuit comprising:
   a first, second, third, fourth, fifth and sixth terminal;
   a driver coupled to said first terminal;
   a receiver coupled to said second terminal;
   a first delay path of a first length extending between said third terminal and said fourth terminal;
   a second delay path of a second length extending between said fifth terminal and said sixth terminal, said second length being longer than said first length;
   said first and third terminals being separated by a first gap, said first and fifth terminals being separated by a second gap, said second and fourth terminals being separated by a third gap, and said second and sixth terminals being separated by a fourth gap, said gaps being recessed in a printed circuit board; and
   an electrically conductive member insertable into said gaps to selectively couple said driver and said receiver through either said first delay path or said second delay path, said electrically conductive member being a passive member.

8. The variable delay path circuit of claim 7 wherein said electrical connecting means comprises a zero ohm resistor.

9. The variable delay path circuit of claim 8 wherein said driver comprises a central processing unit.

10. The variable delay path circuit of claim 9 wherein said receiver comprises a memory device.

11. An assembly comprising:
    a driver coupled to a first terminal on a printed circuit board, said printed circuit board having a plurality of recesses;
    a receiver coupled to a second terminal on said printed circuit board;
    a first electrically conductive trace of a first length extending between a third and fourth terminal on said printed circuit board; and
    a second electrically conductive trace of a second length extending between a fifth and sixth terminal on said printed circuit board, said second length being longer than said first length;
    said first terminal being connectable to either of said third and fifth terminals across one of the plurality of recesses;
    said second terminal being connectable to either of said fourth and sixth terminals across another of the plurality of recesses.

12. The assembly of claim 11 wherein said first and third terminals are electrically coupled by a first zero ohm resistor and said second and fourth terminals are electrically coupled by a second zero ohm resistor.

13. The assembly of claim 11 wherein said first and fifth terminals are electrically coupled by a third zero ohm resistor and said second and sixth terminals are electrically coupled by a fourth zero ohm resistor.

14. The assembly of claim 11 wherein said printed circuit board comprises a first recess disposed between said first and third terminals, a second recess disposed between said first and fifth terminals, a third recess disposed between said second and fourth terminals, and a fourth recess disposed between said second and sixth terminals.

15. The assembly of claim 14 wherein said first recess contains a first electrically conductive member for coupling said first and third terminals and said third recess contains a second electrically conductive member for coupling said second and fourth terminals.

16. The assembly of claim 14 wherein said second recess contains a third electrically conductive member for coupling said first and fifth terminals and said fourth recess contains a fourth electrically conductive member for coupling said second and sixth terminals.

17. The assembly of claim 15 wherein said first and second electrically conductive members comprise zero ohm resistors.

18. The assembly of claim 16 wherein said third and fourth electrically conductive members comprise zero ohm resistors.

19. The assembly of claim 15 wherein said first and second electrically conductive members comprise solder.

20. The assembly of claim 16 wherein said third and fourth electrically conductive members comprise solder.

21. The assembly of claim 15 wherein said first and second electrically conductive members comprise copper slugs.

22. The assembly of claim 16 wherein said third and fourth electrically conductive members comprise copper slugs.

23. A variable delay path circuit comprising:
- a driver, said driver to send a clocking signal having a frequency;
- a receiver, said receiver to receive a data signal and said clocking signal, said clocking signal to latch in said data signal into said receiver;
- a first delay path of a first length extending between said driver and said receiver, and
- a second delay path of a second length extending between said driver and said receiver, said second length being longer than said first length, said first delay path of said first length and said second delay path of said second length couplable between said driver and said receiver based on said frequency.

24. The variable delay path circuit of claim 23 wherein
said driver is coupled to a first terminal;
said receiver is coupled to a second terminal;
said first delay path extends between a third terminal and a fourth terminal; and
said second delay path extends between a fifth terminal and a sixth terminal.

25. The variable delay path circuit of claim 24 further comprising:
- a first zero ohm resistor disposed between and coupling said first and third terminals; and
- a second zero ohm resistor disposed between and coupling said second and fourth terminals.

26. The variable delay path circuit of claim 24 further comprising:
- a third zero ohm resistor disposed between and coupling said first and fifth terminals; and
- a fourth zero ohm resistor disposed between and coupling said second and sixth terminals.

* * * * *